United States Patent
Zhang et al.

(10) Patent No.: US 9,680,377 B2
(45) Date of Patent: Jun. 13, 2017

(54) INVERTING BUCK-BOOST CONVERTER DRIVE CIRCUIT AND METHOD

(71) Applicant: STMicroelectronics (Shenzhen) R&D Co. Ltd, Shenzhen (CN)

(72) Inventors: Hai Bo Zhang, Shenzhen (CN); Jerry Huang, Shenzhen (CN)

(73) Assignee: STMICROELECTRONICS (SHENZHEN) R&D CO. LTD, Shenzhen (CN)

(*) Notice: Subject to any disclaimer, the term of this patent is extended or adjusted under 35 U.S.C. 154(b) by 172 days.

(21) Appl. No.: 14/538,115

(22) Filed: Nov. 11, 2014

(65) Prior Publication Data
US 2016/0118894 A1  Apr. 28, 2016

(30) Foreign Application Priority Data
Oct. 24, 2014  (CN) .......................... 2014 1 0596357

(51) Int. Cl.
*H02M 3/158* (2006.01)
*H02M 1/08* (2006.01)
H02M 3/156 (2006.01)
H02M 1/00 (2006.01)

(52) U.S. Cl.
CPC ............. *H02M 3/158* (2013.01); *H02M 1/08* (2013.01); *H02M 3/156* (2013.01); *H02M 2001/0032* (2013.01); *H03K 2217/0063* (2013.01); *H03K 2217/0072* (2013.01); *H03K 2217/0081* (2013.01); *Y02B 70/16* (2013.01)

(58) Field of Classification Search
CPC ...... H02M 1/08; H02M 3/158; H02M 3/1582; H02M 3/1584; H02M 3/1588; H02M 3/156; H02M 3/1563; H02M 2001/0032; H02M 2001/0003; H02M 2001/0006; H02M 2001/0009; H02M 2001/0012; H03K 2217/0063; H03K 2217/0072; H03K 2217/0081
See application file for complete search history.

(56) References Cited

U.S. PATENT DOCUMENTS 5,502,632 A * 3/1996 Warmerdam ........ H03K 17/063
363/17
7,307,406 B2 * 12/2007 Shirai ................. H02M 3/1588
323/225
7,538,531 B2 * 5/2009 Ishii ..................... H03K 17/163
323/282

(Continued)

*Primary Examiner* — Emily P Pham
*Assistant Examiner* — Shahzeb K Ahmad
(74) *Attorney, Agent, or Firm* — Gardere Wynne Sewell LLP

(57) ABSTRACT

A driver circuit includes a high-side power transistor having a source-drain path coupled between a first node and a second node and a low-side power transistor having a source-drain path coupled between the second node and a third node. A high-side drive circuit, having an input configured to receive a drive signal, includes an output configured to drive a control terminal of said high-side power transistor. The high-side drive circuit is configured to operate as a capacitive driver. A low-side drive circuit, having an input configured to receive a complement drive signal, includes an output configured to drive a control terminal of said low-side power transistor. The low-side drive circuit is configured to operate as a level-shifting driver.

24 Claims, 5 Drawing Sheets

(56) References Cited

U.S. PATENT DOCUMENTS

| | | | | |
|---|---|---|---|---|
| 8,581,638 B2* | 11/2013 | Chen | ............... | H03K 17/063 |
| | | | | 327/108 |
| 8,710,875 B2* | 4/2014 | Bai | ............... | H02M 3/1588 |
| | | | | 323/284 |
| 8,724,357 B2* | 5/2014 | Imanishi | ............ | H02M 1/08 |
| | | | | 323/271 |
| 9,000,746 B2* | 4/2015 | Briere | ............ | H02M 3/1588 |
| | | | | 323/282 |
| 2007/0159150 A1* | 7/2007 | Hosokawa | ......... | H02M 3/1588 |
| | | | | 323/285 |
| 2010/0148737 A1* | 6/2010 | Li | ............ | H02M 3/1588 |
| | | | | 323/282 |
| 2012/0062190 A1* | 3/2012 | Haiplik | ............ | H02M 3/156 |
| | | | | 323/271 |
| 2012/0257430 A1* | 10/2012 | Truettner | ......... | H02M 7/487 |
| | | | | 363/131 |
| 2013/0033243 A1* | 2/2013 | Takemae | ............ | H02M 3/1588 |
| | | | | 323/271 |
| 2016/0094218 A1* | 3/2016 | van Otten | ......... | H03K 17/102 |
| | | | | 327/427 |

* cited by examiner

INVERTING BUCK-BOOST CONVERTER DRIVE CIRCUIT AND METHOD

PRIORITY CLAIM

This application claims priority from Chinese Application for Patent No. 201410596357.0 filed Oct. 24, 2014, the disclosure of which is incorporated by reference.

TECHNICAL FIELD

This disclosure relates generally to buck-boost converter circuits, and more particularly to a drive circuit and method for driving an inverting buck-boost converter.

BACKGROUND

DC/DC converter circuits are widely used in battery-powered portable devices. Examples of such devices include: a smart phone, a smart watch, a camera, a media player and a number of other portable digital devices. In order to extend battery life, those skilled in the art recognize a need for high efficiency operation under a wide load range. In many instances, the total efficiency of the device is limited by the efficiency of the included inverting buck-boost converter. The reason for this is because greater switching losses arise in the inverting buck-boost converter and a more complex driving circuit design is needed for the inverting buck-boost converter. There is accordingly a need in the art to maximize the battery life by improving the efficiency of the inverting buck-boost converter.

SUMMARY

To improve the efficiency of an inverting buck-boost converter, a driver architecture is disclosed which provides for improved light load efficiency. The architecture uses different drive techniques for the high-side and low-side power transistors. For example, the high-side driver utilizes a capacitive drive technique while the low-side driver utilizes a level shifting drive technique.

In an embodiment, a circuit comprises: a high-side power transistor having a source-drain path coupled between a first node and a second node; a low-side power transistor having a source-drain path coupled between the second node and a third node; a high-side drive circuit having an input configured to receive a drive signal and an output configured to drive a control terminal of said high-side power transistor, said high-side drive circuit including a capacitive driver; and a low-side drive circuit having an input configured to receive a complement drive signal and an output configured to drive a control terminal of said low-side power transistor, said low-side drive circuit including a level-shifting driver.

In an embodiment, a method comprises: receiving a drive signal; receiving a complement drive signal; driving a control terminal of a high-side power transistor having a source-drain path coupled between a first node and a second node in response to said drive signal using a capacitive driver circuit; and driving a control terminal of a low-side power transistor having a source-drain path coupled between the second node and a third node in response to said complement drive signal using a level-shifting driver circuit.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF THE DRAWINGS

Figure 1:
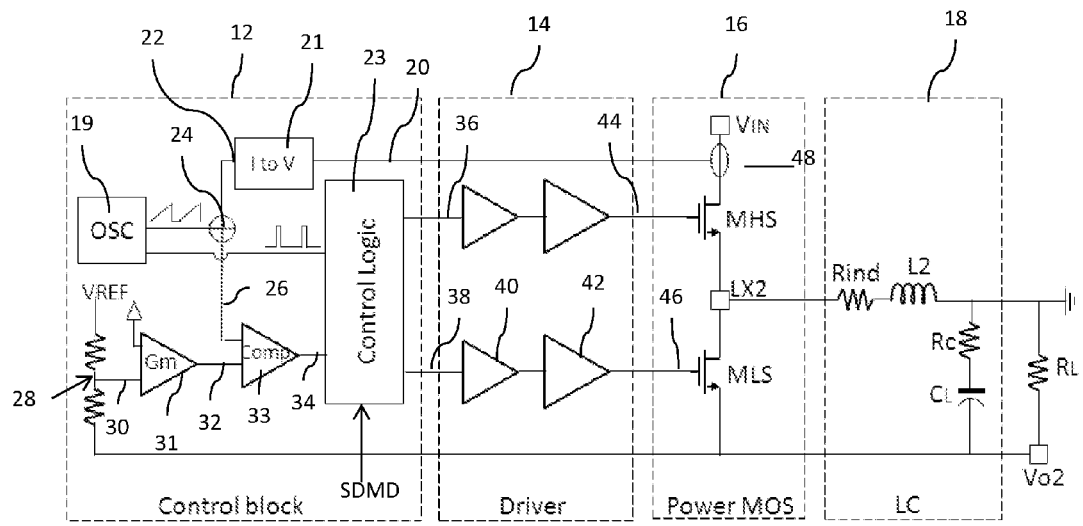
FIG. 1 is a circuit diagram for an inverting buck-boost converter circuit.

Reference is now made to FIG. 1 showing a circuit diagram for an inverting buck-boost converter circuit 10 of the synchronous type. The circuit includes a pulse width modulation (PWM) control circuit (Control Block) 12, a driver circuit 14, a power MOS circuit 16 and a load circuit (LC) 18.

The control circuit 12 includes an oscillator circuit (OSC) 19 configured to generate a sawtooth oscillation signal and a pulse oscillation signal. The two signals have a same frequency. The pulse oscillation signal is applied to a control logic circuit 23 for use, for example, as a timing (clock) reference signal. A current to voltage conversion circuit (I to V) 21 converts a sensed current signal 20 to a voltage signal 22. The voltage signal 22 is then added (by summing circuit 24) to the sawtooth oscillation signal to generate a ramping signal 26. The ramping signal 26 is applied to a first input of a comparator (Comp) 33. A voltage divider circuit 28 receives a reference voltage VREF and generates a divided reference signal 30. The voltage divider circuit 28 is coupled between the reference voltage and an output node Vo2. The divided reference signal 30 is passed through a transconductance amplifier (Gm) 31 to generate a reference signal 32 that is applied to a second input of the comparator (Comp) 33. The comparator (Comp) 33 compares the ramping signal 26 to the reference signal 32 to generate a duty cycle control signal 34 that is applied to the control logic 23. The control logic 23 processes the duty cycle control signal 34 with reference to the pulse oscillation signal to output a first PWM control signal 36 (for high-side driving) and a second PWM control signal 38 (for low-side driving). These signals 36 and 38 may be referred to as DRV and DRV(bar).

Figure 4:
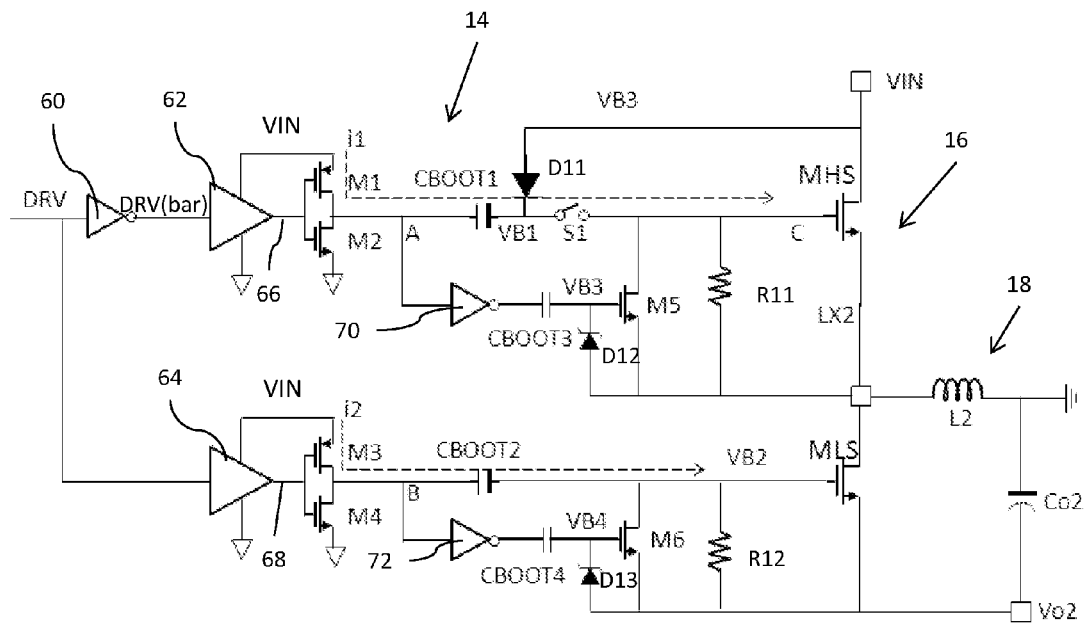
FIG. 4 is a circuit diagram illustrating the driving operation of the inverting buck-boost converter.
Figure 8:
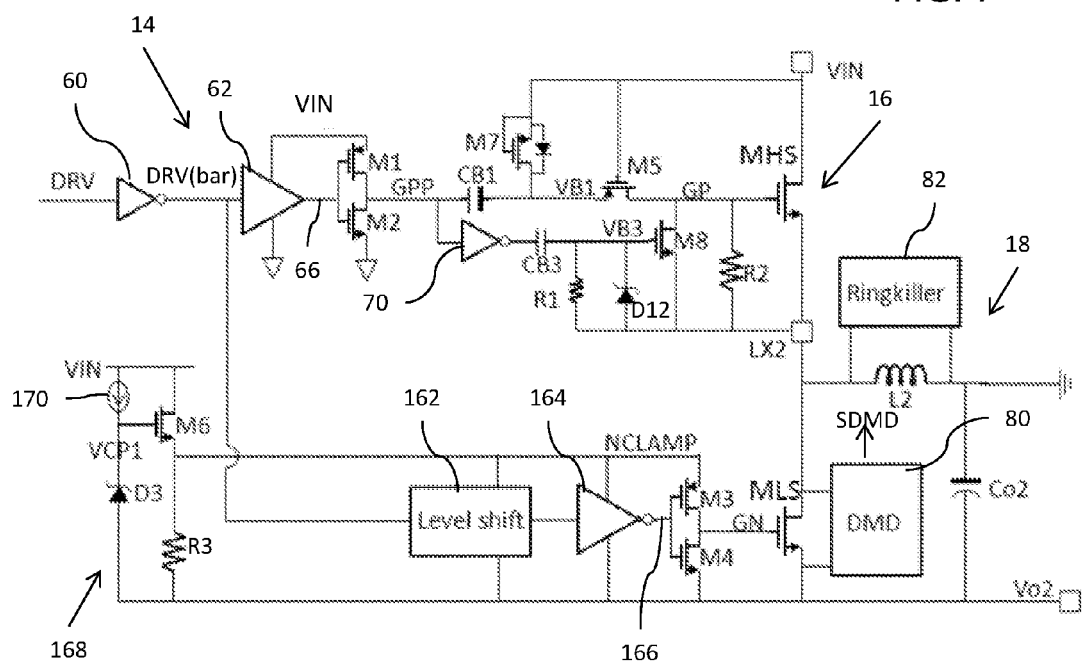
FIG. 8 is a circuit diagram illustrating the driving operation of the inverting buck-boost converter.

The driver circuit 14 receives the first control signal 36 and the second control signal 38 and generates a high-side control signal 44 and a low-side control signal 46. In an example of an embodiment for the driver circuit 14, the first control signal 36 and the second control signal 38 are processed through a level-shifting circuit 40 and a drive amplifier 42 to generate the high-side control signal 44 and the low-side control signal 46, respectively. This implementation is shown in more detail with respect to FIG. 2, as will be described herein. It will also be noted that in other embodiments, the driver circuit 14 may instead be implemented as shown in FIG. 4 or FIG. 8, as will be described herein. The reference to driver circuit 14 in FIG. 1 accordingly covers each of the implementations shown in FIGS. 2, 4 and 8.

The power MOS circuit 16 includes a high-side drive transistor (MHS) and a low-side drive transistor (MLS) whose source-drain paths are connected in series at node LX2 between an input voltage node VIN and the output node Vo2. The transistors MHS and MLS are n-type power MOSFET devices. More particularly, in an embodiment, the transistors MHS and LHS are power NDMOS devices. The high-side transistor MHS is configured to be controlled by the high-side control signal 44, while the low-side transistor MLS is configured to be controlled by the low-side control signal 46. Current in the circuit path formed by the series connected source-drain paths of the transistors is sensed by a current sensing circuit 48. The output of the current sensing circuit comprises the signal 20 applied to the input of the I to V circuit 21.

The load circuit 18 includes a load inductance (represented by a resistive component Rind and inductive component L2) coupled between the node LX2 and a reference supply node such as ground (GND). The load circuit 18 further comprises a load capacitance (represented by a resistive component Rc and a capacitive component CL) coupled between the output node Vo2 and the ground reference supply node. The load circuit 18 further comprises a load resistance (represented by resistive component RL) coupled between the output node Vo2 and the ground reference supply node.

The power loss of the inverting buck-boost converter 10 can be divided into four parts corresponding to the control circuit 12, the driver circuit 14, the power MOS circuit 16 and the load circuit 18. So, there is a basic control block loss, a driver loss, a power MOS loss and a load (inductor) loss. Among these losses, the power MOS loss is composed of conduction loss and switching loss. The power loss can be expressed in accordance with the following equation:

$$P_{loss} = V_{IN} \times I_q + P_{loss,driver} + P_{loss,switch} + P_{loss,rdson} + P_{loss,ind} \quad (1)$$

In Equation (1), it may be assumed that both $V_{IN} \times I_q$ and $P_{loss,switch}$ are constant because the driver speed and power MOS are the same. So, it is appropriate to just analyze the following losses:

Inductor loss:

$$P_{loss,ind} = I_{ind,rms}^2 \times R_{ind} \quad (2)$$

The drain-to-source resistance conduction loss (Rdson):

$$P_{loss,rdson} = I_{highside,rms}^2 \times R_{dson,MHS} + I_{lowside,rms}^2 \times R_{dson,MLS} \quad (3)$$

The driver loss:

$$P_{loss,driver} = P_{loss,driver,quie} + P_{loss,driver,switch} \quad (4)$$

In equations (2)-(4), $P_{loss,driver,quie}$ is the driver quiescent loss, $P_{loss,driver,switch}$ is the driver switching loss, $R_{dson,MHS}$ is the high-side power MOS conduction resistance value, $R_{dson,MLS}$ is the low-side power MOS conduction resistance value, and $R_{ind}$ is the inductor internal resistance. When considering portable device applications, a small packaged inductor is used and its internal resistance will be large. In such a case, the inductor loss makes a significant proportional contribution to total loss.

Figure 2:
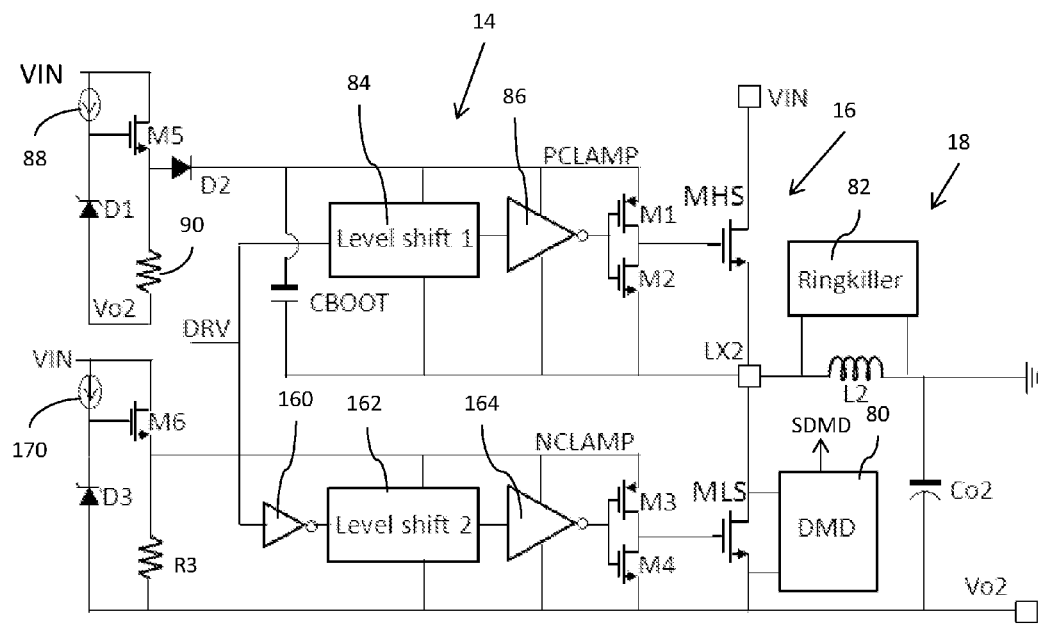
FIG. 2 is a circuit diagram illustrating the driving operation of the inverting buck-boost converter.

Reference is now made to FIG. 2 showing the driving operation of the inverting buck-boost converter 10 of FIG. 1 with additional circuit details shown. The discontinuous mode detection (DMD) block 80 functions to detect the current across the transistor MLS when the low-side power MOS MLS is on and high-side power MOS MLH is off. When the sensed current decreases to zero, the DMD block generates a signal (SDMD) that is applied to control logic (see, FIG. 1) to cause the low-side power MOS MLS to be switched off. After switch off of the low-side transistor MLS due to DMD detection, the ringkiller block 82 functions to eliminate ringing on the node LX2 (with respect to load inductor L2 and output capacitor Co2) during the time both the high-side transistor MHS low-side transistor MLS are both turned off The circuit of FIG. 2 includes a high-side level shifter (level shift 1) 84 that functions to shift the signal logic power supply from between internal voltage VDD and the reference supply voltage ground (GND) to between the voltage PCLAMP and the voltage at node LX2. This process may use at least a two stage level shifting circuit and is assisted by the bootstrap capacitor CBOOT. The output of the level shift 84 is applied through an inverter 86 (powered from the regulated voltage PCLAMP) to the input of a half-bridge drive circuit formed by transistors M1 and M2 (also powered from the regulated voltage PCLAMP). The output of the half-bridge drive circuit is applied to the gate terminal of the high-side power transistor MHS. A low-side level shifter (level shift 2) 162 is provided to shift the signal logic power supply from between internal voltage VDD and the supply reference voltage GND to between the voltage NCLAMP and the voltage at the output node Vo2. This circuit may require only a one stage level shifting circuit. The output of the level shift 162 is applied through an inverter 164 (powered from the regulated voltage NCLAMP) to the input of a half-bridge drive circuit formed by transistors M3 and M4 (also powered from the regulated voltage NCLAMP). The output of the half-bridge drive circuit is applied to the gate terminal of the low-side power transistor MLS. So, in this configuration, the level shifting circuit 40 (FIG. 1) is provided at least by the shifters 84/162 and the amplifier 42 (FIG. 1) is provided at least by the transistors M1/M2 and M3/M4.

The regulating circuit for generating the voltage PCLAMP receives the voltage VIN and includes a current source 88, zener diode D1 and junction diode D2, transistor M5 and a resistor 90 connected in the manner illustrated. The regulating circuit for generating the voltage NCLAMP receives the voltage VIN and includes a current source 170, zener diode D3, transistor M6 and a resistor R3 connected in the manner illustrated. The drive signal DRV is applied to an inverter 160 and then applied to the level shift 2 circuit 162. The output from the level shift 2 circuit 162 is inverted by inverter 164 so as to ensure that the high and low-side circuits are not simultaneously actuated.

Figure 3:
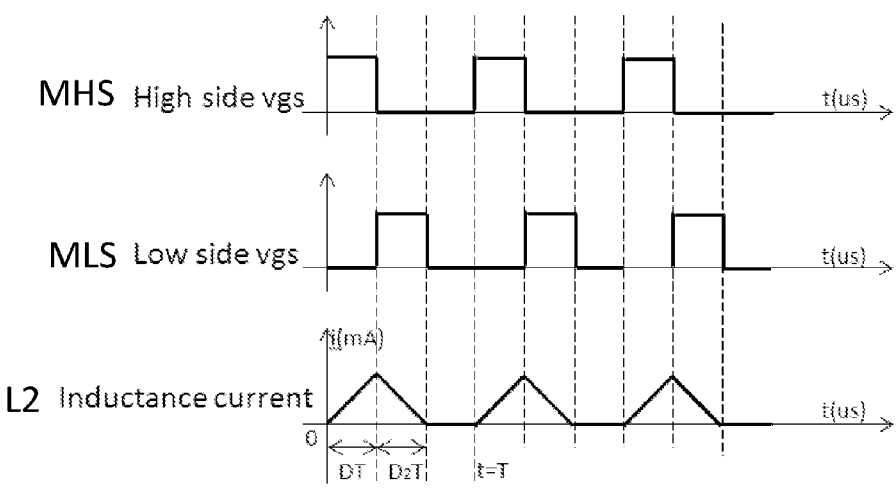
FIG. 3 shows the working waveform for light load for the driver of FIG. 2.

Assume that the converter circuit is operating in a steady state mode. The working waveform for a light load operation of the circuit of FIG. 2 is shown in FIG. 3. At phase 1, t=0, the DRV signal changes from logic 0 to logic 1. The low-side power MOS MLS switches off in response to transistor M4 and then the high-side power MOS MHS switches on. The current in the inductor L2 starts to increase. The voltage at the node LX2 is then pulled up to VIN. Because diode D2 is reverse biased, the initial voltage on the capacitor CBOOT is equal to VCLAMPD1−VGS5−0.7. So, the high-side voltage is:

$$V_{gs},\text{high} = (V\text{CLAMP}D1 - V\text{GS}5 - 0.7) \times C\text{BOOT}/(C\text{BOOT} + C_{gs},\text{high}).$$

At phase 2, t=DT, the DRV signal changes from logic 1 to logic 0. The high-side power MOS MHS switches off in response to transistor M2 and then the low-side power MOS switches on. The current in the inductor L2 starts to decrease. The voltage at node LX2 is pulled down to the voltage at node Vo2 by the low-side power transistor MLS. At this time, the capacitor CBOOT is again charged to VCLAMPD1−VGS5−0.7, and the energy saved in the inductor L2 is transferred to output node Vo2. If the loading is light enough, the control loop will enter DCM mode.

Turning next to phase 3, when current in the inductor drops to zero, both the high-side and low-side power transistors MHS and MLS are turned off until the next clock edge (oscillating pulse signal) is received (at time t=T). During this period of phase 3, the node LX2 is connected to the reference supply node ground through the ringkiller 82.

The calculation of loss at light load for the circuit of FIG. 2 is as follows:

Inductor loss:

$$P_{loss,ind} = \frac{1}{T}\left[\int_0^{DT}\left(\frac{V_{IN}}{L}t\right)^2 dt + \int_{DT}^{DT+D_2T}\left(\frac{V_{IN}+V_{O2}}{L}DT - \frac{V_{O2}}{L}t\right)^2 dt + \int_{DT+D_2T}^{T} 0\, dt\right] \times R_{ind} \quad (5)$$

$$= \frac{1}{3}T^2\left(\frac{V_{IN}}{L}\right)^2 D^3 \times R_{ind} + \frac{1}{3}T^2\left(\frac{V_{O2}}{L}\right)^2\left(\frac{V_{IN}}{V_{O2}}\right)^3 D^3 \times R_{ind}$$

Where:

$$D = \frac{\sqrt{2LI_{O2}V_{O2}}}{VIN} \quad (6)$$

So:

$$P_{loss,ind} = \frac{1}{3VIN}\sqrt{\frac{T}{L}}(2I_{O2}V_{O2})^{3/2} \times R_{ind} + \frac{1}{3V_{O2}}\sqrt{\frac{T}{L}}(2I_{O2}V_{O2})^{3/2} \times R_{ind} \quad (7)$$

$$= (A_{hs} + A_{ls}) \times (I_{O2})^{3/2} \times R_{ind}$$

The drain-to-source resistance conduction loss (Rdson):

$$P_{loss,rdson} = \frac{1}{3VIN}\sqrt{\frac{T}{L}}(2I_{O2}V_{O2})^{3/2} \times R_{on,MHS} + \frac{1}{3V_{O2}}\sqrt{\frac{T}{L}}(2I_{O2}V_{O2})^{3/2} \times R_{on,LHS} \quad (8)$$

$$= A_{hs} \times (I_{O2})^{3/2} \times R_{on,MHS} + A_{ls} \times (I_{O2})^{3/2} \times R_{on,LHS}$$

The driver loss:

$$P_{loss,driver} = P_{loss,driver,regulator} + P_{loss,driver,levelshift} + P_{loss,driver,switch} \quad (9)$$

$$P_{loss,hs,driver,switch} = \frac{1}{T}\int(V_{ds,M5} + V_{D2})dt \quad (10)$$

$$P_{loss,ls,driver,switch} = \frac{1}{T}\int(V_{ds,M6} + V_{ds,M3})dt \quad (11)$$

$$P_{loss,driver} = P_{loss,driver,regulator} + P_{loss,driver,levelshift} + \frac{1}{T}\int(V_{ds,M5} + V_{D2})dt + \frac{1}{T}\int(V_{ds,M6} + V_{ds,M3})dt \quad (12)$$

It will be noted that the drive circuit of FIG. 2 requires two regulators and many level shifts. From equation (12), it will be noted that the driver also has a significant switching loss. If the response time of the level shifter is, for example, around 2 ns or less, there will be a significant loss experienced with operation of the circuit shown in FIG. 2.

Reference is now made to FIG. 4 showing a circuit diagram illustrating the driving operation of the inverting buck-boost converter of FIG. 1. In this configuration, a capacitive buck-boost driving methodology is presented. The driver of FIG. 4 does not need the level shifting circuits and regulators required by FIG. 2. In this case, the driver of FIG. 4 drives the power MOS transistors by using a coupled capacitor circuit.

The drive signal DRV is received and applied to an inverter 60 and thus complementary drive signals DRV and DRV(bar) are made available. Buffer amplifier circuits 62 and 64 receive the drive signals DRV and DRV(bar) and produce complementary buffered signals 66 and 68, respectively. The circuits 62 and 44 are powered from voltage supply node VIN. A high-side half bridge drive circuit formed by transistors M1 and M2 (also powered from supply node VIN) receives the signal 66 and outputs a first control signal at node A. A low-side half bridge drive circuit formed by transistors M3 and M4 receives the signal 68 and outputs a second control signal at node B. The coupled capacitor circuit is formed on the high and low-side by a pair of boost capacitors as described in detail below.

Turning first to the high-side circuit, the first control signal at node A is applied to an inverter circuit 70 and thus complementary first control signals are generated. The non-inverted first control signal (at node A) is applied to a bootstrap capacitor CBOOT1 coupled between node A and node VB1. The inverted first control signal (from inverter 70) is applied to a bootstrap capacitor CBOOT3 coupled between the output of the inverter 70 and node VB3. A junction diode D11 is coupled between node VB1 (at the cathode) and the input voltage node VIN (at the anode). A switch S1 is coupled between node VB1 and node C. The switch may be implemented as a MOS transistor (see, FIG. 8). The node C is connected to the gate terminal of the high-side power transistor MHS, with the current i1 through capacitor CBOOT1 applied to drive transistor operation. A MOS transistor M5 has its source-drain path coupled between node C and node LX2. The gate terminal of transistor M5 is connected to node VB3. A zener diode D12 is coupled between node VB3 (at the cathode) and the node LX2 (at the anode). A resistor R11 is coupled between node C and node LX2.

With respect to the low-side circuit, the second control signal at node B is applied to an inverter circuit 72 and thus complementary second control signals are generated. The non-inverted second control signal (at node B) is applied to a bootstrap capacitor CBOOT2 coupled between node B and node VB2. The node VB2 is connected to the gate terminal of the low-side power MOS transistor MLS, with the current i2 applied through capacitor CBOOT2 to drive transistor operation. The inverted second control signal (from inverter 72) is applied to a bootstrap capacitor CBOOT4 coupled between the output of the inverter 72 and node VB4. A MOS transistor M6 has its source-drain path coupled between node VB2 and the output node Vo2. The gate terminal of transistor M6 is connected to node VB4. A zener diode D13 is coupled between node VB4 (cathode) and the node Vo2 (anode). A resistor R12 is coupled between node VB2 and node Vo2.

Figure 5:
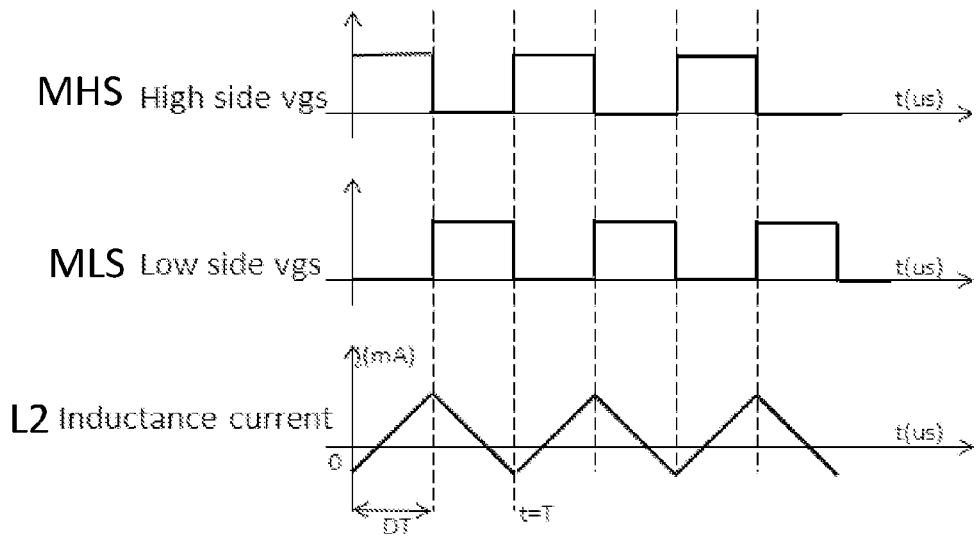
FIG. 5 shows the working waveform for light load for the driver of FIG. 4.

Assume that the converter circuit of FIG. 4 is operating in a steady state mode. The working waveform for a light load operation of the circuit of FIG. 4 is shown in FIG. 5. At phase 1, t=0, the DRV signal changes from logic 0 to logic 1. The capacitor CBOOT1 will have an initial voltage of about VIN−0.7. The low-side power transistor MLS switches off. The high-side driver transistor M1 switches from 0 to VIN. The node VB1 voltage is booted to VIN+VIN−0.7. Some charge is then discharged to the gate terminal of the high-side power transistor MHS (through the capacitor CBOOT1), and the transistor MHS will also turn on. The voltage at node LX2 is then pulled up to VIN from the voltage at output node Vo2.

At phase 2, t=DT, the DRV signal changes from logic 1 to logic 0. The high-side driver transistor M1 switches from VIN to the reference supply voltage ground. The voltage at node VB1 is then coupled to VIN−VD. The switch S1 opens to disconnect the gate of transistor MHS from the capacitor CBOOT1. Current flows through diode D11 through capacitor CBOOT1 in the opposite direction to ground through transistor M2. The transistor M5 turns on and the high-side power transistor MHS is turned off. Then, the voltage at node VB2 is coupled to high and the low-side power transistor MLS turns on. Inductor current starts to decrease. If the load is light, this loop still works in PWM mode. When the current in the inductor drops to zero, the low-side power transistor MLS does not switch off until receipt of the next clock edge (oscillating pulse signal) at time t=T. The current in the inductor current is thus shown to reverse direction.

The calculation of loss for the circuit of FIG. 4 at light load is as follows:

Inductor loss:

$$P_{loss,ind} = \frac{1}{T}\left[\int_0^{DT}\left(Y_0 + \frac{V_{IN}}{L}t\right)^2 dt + \int_0^{T-DT}\left(Y_0 + \frac{V_{02}}{L}t\right)^2 dt\right] \times R_{ind} \quad (13)$$

Where:

$$D = \frac{V_{02}}{V_{IN} + V_{02}} \text{ and} \quad (14)$$

$$I_0 = \frac{1}{T}\int_0^{T-DT}\left(Y_0 + \frac{V_{02}}{L}t\right)dt$$

$$P_{loss,ind} = \left(\frac{V_{02}(V_{IN}+V_{02})}{VIN^2}I_{02}^2 + \frac{1}{12}\left(\frac{T}{L}\right)^2\frac{VIN^2 V_{02}^3}{(VIN+V_{02})^3}\right)\times R_{ind} + \quad (15)$$

$$\left(\frac{VIN+V_{02}}{VIN}I_{02}^2 + \frac{1}{12}\left(\frac{T}{L}\right)^2\frac{VIN^3 V_{02}^2}{(VIN+V_{02})^3}\right)\times R_{ind}$$

$$= (B_{hs} + B_{ls})I_{02}^2 \times R_{ind} + (C_{hs} + C_{ls}) \times R_{ind}$$

The drain-to-source resistance conduction loss (Rdson):

$$P_{loss,rdson} = \left(\frac{V_{02}(V_{IN}+V_{02})}{VIN^2}I_{02}^2 + \frac{1}{12}\left(\frac{T}{L}\right)^2\frac{VIN^2 V_{02}^3}{(VIN+V_{02})^3}\right)\times R_{on,MHS} + \quad (16)$$

$$\left(\frac{VIN+V_{02}}{VIN}I_{02}^2 + \frac{1}{12}\left(\frac{T}{L}\right)^2\frac{VIN^3 V_{02}^2}{(VIN+V_{02})^3}\right)\times R_{on,LHS}$$

$$= (B_{hs}I_{02}^2 + C_{hs})\times R_{on,MHS} + (B_{ls}I_{02}^2 + C_{ls})\times R_{on,LHS}$$

The driver loss:

$$P_{loss,driver} = P_{loss,driver,switch} \quad (17)$$

The following Table compares the operation of the driving methodology of FIG. 2 to the driving methodology of FIG. 4:

| | FIG. 2 driver | FIG. 4 driver |
|---|---|---|
| Inductor loss | $(A_{hs} + A_{ls}) \times (I_{02})^{3/2} \times R_{ind}$ | $(B_{hs} + B_{ls})I_{02}^2 \times R_{ind} +$ $(C_{hs} + C_{ls}) \times R_{ind}$ |
| DMOS conductor loss | $A_{hs} \times (I_{02})^{3/2} \times R_{on,MHS} + A_{ls} \times (I_{02})^{3/2} \times R_{on,LHS}$ | $(B_{hs}I_{02}^2 + C_{hs}) \times R_{on,MHS} +$ $(B_{ls}I_{02}^2 + C_{ls}) \times R_{on,LHS}$ |
| Driver loss | $P_{loss,driver,regulator} +$ $P_{loss,driver,levelshift} +$ $P_{loss,driver,switch}$ | $P_{loss,driver,switch}$ |

In a non-limiting example, consider VIN=3.7V, |Vo2|=4V, an inductor resistance of 0.25 ohm, a high-side drive transistor Rdson=0.2 ohm and a low-side Rdson=0.2 ohm. Then for the inductor and DMOS conductor loss:

FIG. 2 driver: $P_{loss,ind\&rdson} = 0.6647 \times (I_{02})^{3/2}$ (18)

FIG. 4 driver: $P_{loss,ind\&rdson} = 1.949I_{02}^2 + 0.0028$ (19)

Figure 6:
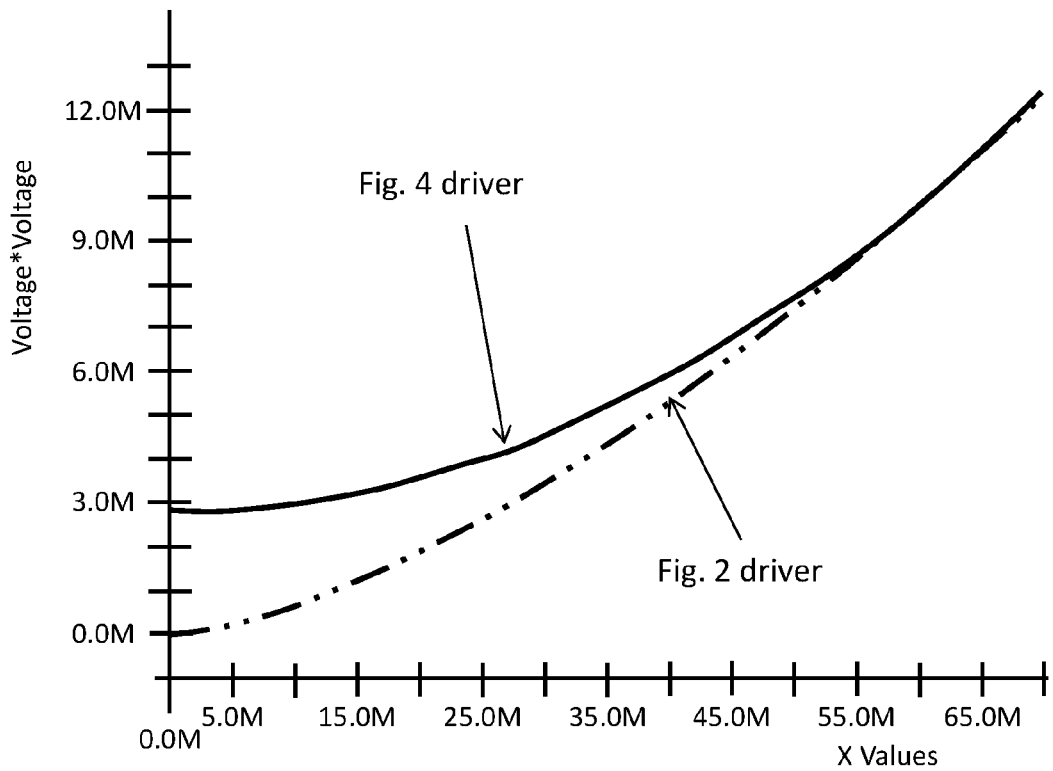
FIG. 6 is a curve comparing inductor and Rdson power loss versus load for the drivers shown in FIGS. 2 and 4.

FIG. 6 shows a curve of inductor and Rdson power loss versus load in accordance with the non-limiting example. This shows that the driver of FIG. 4 experiences more inductor and Rdson loss than the driver of FIG. 2. However, from the Table above, it is noted that the FIG. 4 driver has no loss due to regulator or level shifter circuit operation. These losses experienced with the driver of FIG. 2 can be significant.

Figure 7:
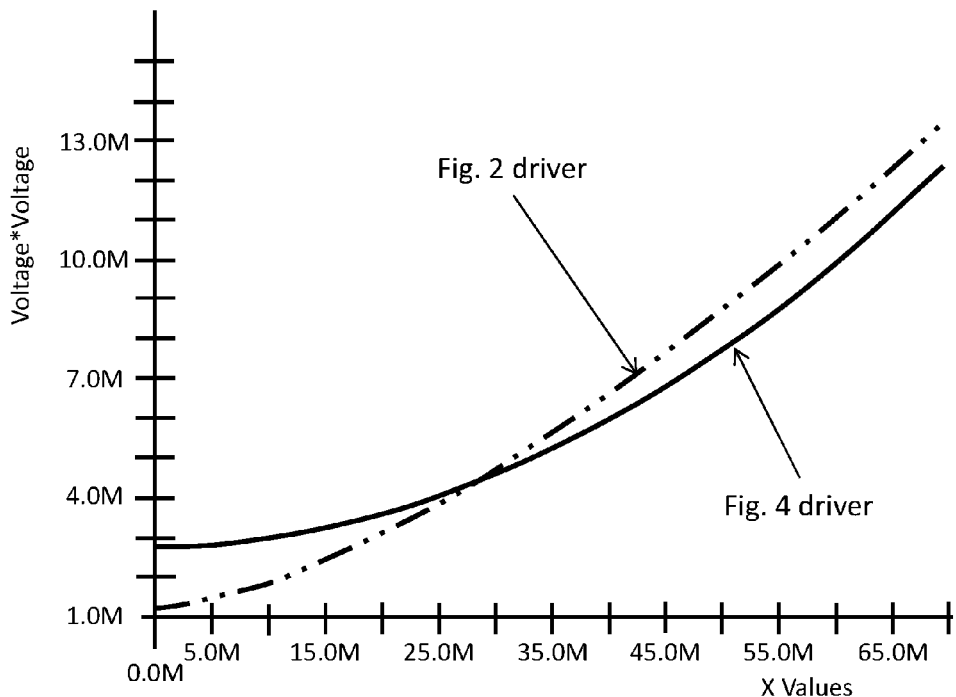
FIG. 7 is a curve comparing the efficiency of the drivers shown in FIGS. 2 and 4.

FIG. 7 shows a curve comparing the efficiency of the drivers shown in FIGS. 2 and 4. The curve indicates that the driver of FIG. 4 experiences less loss than the driver of FIG. 2 at loads higher than a threshold (in this example, at about 30 mA), but experiences higher loss than the driver of FIG. 2 at loads less than the threshold.

Reference is now made to FIG. 8 showing a circuit diagram illustrating the driving operation of the inverting buck-boost converter of FIG. 1. In this configuration, a mixed buck-boost driving methodology is presented. The driver of FIG. 8 utilizes the level shifting circuits and regulators (compare to FIG. 2) for driving the low-side power transistor MLS and utilizes the coupled capacitor circuits (compare to FIG. 4) for driving the high-side power transistor MHS.

The drive signal DRV is received and applied to an inverter 60 and thus complementary drive signals DRV and DRV(bar) are made available.

Turning first to the high-side drive circuitry: a buffer amplifier circuit 62 (powered from supply node VIN) receives the drive signal DRV(bar) and produces a buffered signal 66. A high-side half bridge drive circuit formed by transistors M1 and M2 (also powered from supply node VIN) receives the signal 66 and outputs a first control signal at node GPP. The coupled capacitor circuit is formed on the high-side by a pair of boost capacitors. The first control signal at node GPP is applied to an inverter circuit 70 and thus complementary first control signals are generated. The non-inverted first control signal (at node GPP) is applied to a bootstrap capacitor CB1 coupled between node GPP and node VB1. The inverted first control signal (from inverter 70) is applied to a bootstrap capacitor CB3 coupled between the output of the inverter 70 and node VB3. A diode-connected MOSFET M7 is coupled between node VB1 (at the cathode) and the input voltage node VIN (at the anode). A transistor M5(switch S1, FIG. 4) is coupled between node VB1 and node GP, with the gate of transistor M5 coupled to the input voltage VIN so that transistor M5 turns on in response to VIN and the voltage at node VB1. The node GP is connected to the gate terminal of the high-side power transistor MHS. A high-side drive signal is generated by the coupled capacitor circuit at node GP. A MOS transistor M8 has its source-drain path coupled between node GP and node LX2. The gate terminal of transistor M8 is connected to node VB3. A zener diode D12 is coupled between node VB3 (cathode) and the node LX2 (anode). A resistor R1 is also coupled between node VB3 and node LX2 (in parallel with diode D12). A resistor R2 is coupled between node GP and node LX2.

Turning next to the low-side drive circuitry: the drive signal DRV(bar) is received and applied to the input of a level shifter 162 powered from a regulated voltage NCLAMP. An inverter circuit 164 (also powered from the voltage NCLAMP) receives the level shifted drive signal DRV(bar) and produces a buffered signal 166. A half-bridge drive circuit formed transistors M3 and M4 (having series coupled source-drain paths coupled between NCLAMP and output node Vo2) is configured to receive the buffered signal 166 and generate a low-side drive signal at node GN. The node GN is connected to the gate terminal of the low-side power transistor MLS. The regulated voltage NCLAMP is generated by a circuit 168 including a current source 170 coupled in series with a zener diode D3 at node VCP1 between the input voltage node VIN and the output voltage node V02. A MOS transistor M6 is coupled to the input node VIN and configured to generate the voltage NCLAMP. A gate of the transistor M6 is coupled to node VCP1. A resistor R3 is coupled between the source of transistor M6, where the voltage NCLAMP is generated, and the output node Vo2.

The discontinuous mode detection (DMD) block 80 functions to detect the current across the transistor MLS when the low-side power MOS is on and high-side power MOS is off. When the sensed current decreases to zero, the DMD block 80 generates a signal (SDMD) that is applied to control logic (see, FIG. 1) to cause the low-side power MOS MLS to be switched off. After switch off of the low-side transistor MLS due to DMD detection, the ringkiller block 82 (coupled in parallel with the output inductance L2) functions to eliminate ringing on the node LX2 during the time both the high-side transistor MHS low-side transistor MLS are both turned off. An output capacitor Co2 is coupled between the output node Vo2 and the reference supply ground.

Figure 9:
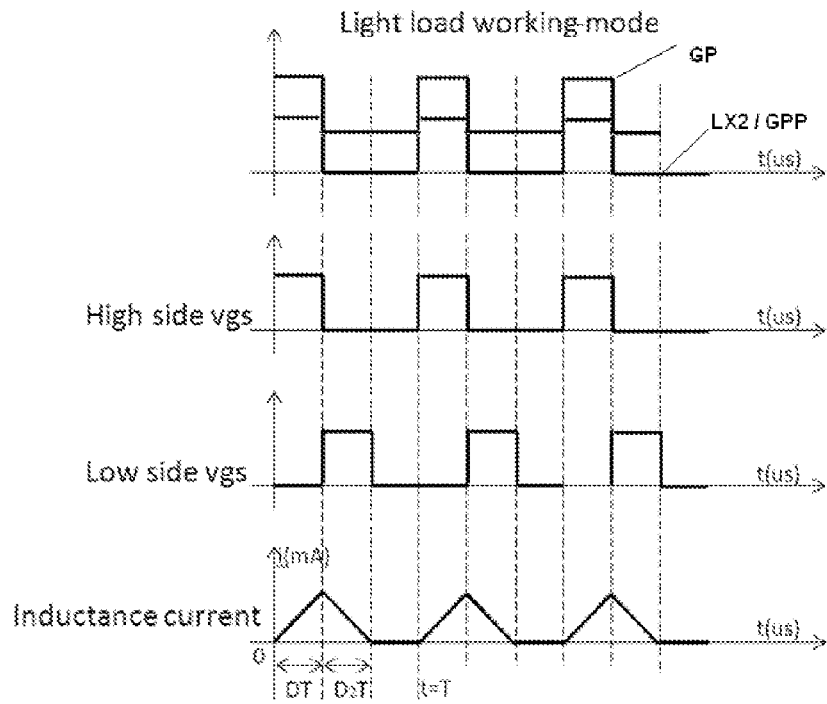
FIG. 9 shows the working waveform for light load for the driver of FIG. 8.

Assume that the converter circuit of FIG. 8 is operating in a steady state mode. The working waveform for a light load operation of the circuit of FIG. 8 is shown in FIG. 9. At phase 1, t=0, the DRV signal changes from logic 0 to logic 1. The low-side power transistor MLS switches off through the transistor M4. In the high-side driver, the transistor M1 switches on and a current is applied to the gate of transistor MHS. The voltage at node VB1 is booted to VIN+VIN−VTHM7, and this voltage is higher than the voltage VIN+VTHM5. So, at this time, the voltage at node GP equals the voltage at node VB1. In this configuration, the high-side power MOS MHS will switch on (responsive to current from the capacitor CB1) and the current in the inductor will increase. The voltage at node LX2 is thus pulled up to VIN.

At phase 2, t=DT, the DRV signal changes from logic 1 to logic 0. Here, the transistor M2 switches on. The voltage at node GPP is then pulled to low. The voltage at node VB1 is lower than the voltage VIN−VTH7 so current flows in the reverse direction through capacitor CB1 via diode-connected transistor M7 and transistor M2. The capacitor CB1 is then charged to the voltage VIN−VTH7 which causes the transistor M5 to be turned off, thus disconnecting the gate of transistor MHS from node VB1. At this time, the transistor M8 is turned on. The high-side power MOS MHS switches off by current drained through transistor M8. Then, the gate of the low-side power MOS transistor MLS is charged to high by a current flowing through transistors M6 and M3. The inductor current starts to decrease.

At phase 3, t=(D+D2)T, both high of the high and low-side power MOS transistors MHS and MLS are turned off. The node LX2 is shorted to GND through the discharged inductor L2.

The calculation of loss for the circuit of FIG. 8 at light load is as follows:

Inductor loss:

$$P_{loss,ind} = \frac{1}{3VIN}\sqrt{\frac{T}{L}}(2I_{02}V_{O2})^{3/2} \times R_{ind} + \qquad (20)$$

$$\frac{1}{3V_{O2}}\sqrt{\frac{T}{L}}(2I_{02}V_{O2})^{3/2} \times R_{ind}$$

$$= (A_{hs} + A_{ls}) \times (I_{02})^{3/2} \times R_{ind}$$

The drain-to-source resistance conduction loss (Rdson):

$$P_{loss,rdson} = A_{hs} \times (I_{02})^{3/2} \times R_{on,MHS} + A_{ls} \times (I_{02})^{3/2} \times R_{on,LHS} \qquad (21)$$

The driver loss:

$$P_{loss,driver} = P_{loss,lowside,driver,regulator} + P_{loss,lowside,driver,levelshift} + P_{loss,driver,switch} \qquad (22)$$

Considering equation (22), it is noted that, in comparison to the FIG. 4 implementation, just low-side regulator loss and low-side level shift loss are added in driving loss. So, low-side driver loss is much less than high-side driver for the FIG. 2 implementation.

Figure 10:
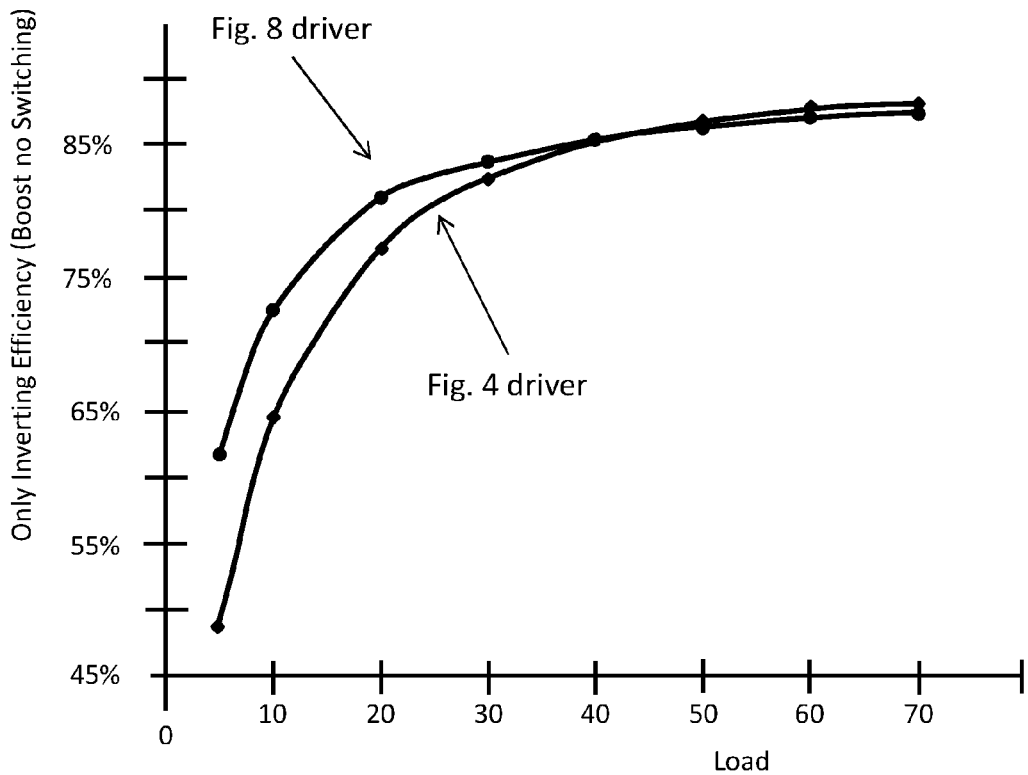
FIG. 10 is a curve comparing the efficiency of the drivers shown in FIGS. 4 and 8.

Reference is now made to FIG. 10 showing a curve comparing the efficiency of the drivers shown in FIGS. 8 and 4. From a test result comparison between the driver of FIG. 8 and the driver of FIG. 4, it is noted the driver of FIG. 8 presents an efficiency improvement over the driver of FIG. 4 below a threshold (in this example, at about 20 mA load) while presenting an equivalent efficiency curve at loads above the threshold (see, for example, loads at 50-70 mA).

The driver of FIG. 8 presents a further advantage over the driver of FIG. 4 in that the circuit can fabricated as an integrated circuit using less area at least because the low-side driver does not need use space consuming capacitors.

It will be readily understood by those skilled in the art that materials and methods may be varied while remaining within the scope of the present disclosure. It is also appreciated that the present disclosure provides many applicable inventive concepts other than the specific contexts used to illustrate embodiments. Accordingly, the appended claims are intended to include within their scope such processes, machines, manufacturing, compositions of matter, means, methods, or steps.

What is claimed is:

1. A circuit, comprising:
a high-side power transistor having a source-drain path coupled between a first node and a second node;
a low-side power transistor having a source-drain path coupled between the second node and a third node;
a high-side drive circuit having an input configured to receive a drive signal and an output configured to drive a control terminal of said high-side power transistor, said high-side drive circuit including a capacitive driver comprising a first bootstrap capacitor having a first capacitor terminal coupled to said input of the high-side drive circuit and a second capacitor terminal coupled to the control terminal of said high-side power transistor; and
a low-side drive circuit having an input configured to receive a complement drive signal and an output configured to drive a control terminal of said low-side power transistor, said low-side drive circuit including a level-shifting driver; and
wherein said capacitive driver comprises:
    a first half-bridge driver having an input responsive to said drive signal; and
    wherein the first capacitor terminal of the first bootstrap capacitor is coupled to an output of the first half-bridge driver;
    an inverting circuit configured to invert the output of the first half-bridge driver;
    a second bootstrap capacitor having a first capacitor terminal coupled to an output of the inverting circuit and a second capacitor terminal coupled to a fourth node; and
    a transistor having a source-drain path coupled between the control terminal of the high-side power transistor and the second node, said transistor having a control terminal coupled to said fourth node.

2. The circuit of claim 1, wherein the first node is coupled to receive a positive supply voltage and the third node is configured to output a negative supply voltage, further including a load circuit coupled to the third node.

3. The circuit of claim 1, wherein said level-shifting driver comprises:
    a level shifting circuit having an input responsive to said complement drive signal; and
    a second half-bridge driver having an input responsive an output of the level shifting circuit and an output coupled to the control terminal of said low-side power transistor.

4. The circuit of claim 3, wherein said level-shifting driver further comprises a regulator circuit configured to generate a clamp voltage supplying power to said level shifting circuit and said second half-bridge driver.

5. The circuit of claim 1, wherein said capacitive driver further comprises:
    a switching transistor having a source drain path coupled between the second capacitor terminal of the first bootstrap capacitor and the control terminal of the high-side power transistor, wherein a control terminal of the switching transistor is coupled to said first node.

6. The circuit of claim 5, wherein said capacitive driver further comprises a diode having a first terminal coupled to said first node and a second terminal coupled to a fifth node positioned between the second capacitor terminal of the first bootstrap capacitor and the switching transistor.

7. The circuit of claim 1, wherein the capacitive driver further comprises a clamping circuit having a first terminal coupled to the control terminal of said transistor and a second terminal coupled to the second node.

8. The circuit of claim 1, further comprising a pulse width modulated (PWM) control circuit configured to generate said drive signal and said complement drive signal as PWM signals.

9. The circuit of claim 8, further comprising a feedback circuit having an input coupled to said third node and an output coupled to an input of said PWM control circuit.

10. The circuit of claim 8, further comprising a current sensing circuit configured to sense current flow through said high-side power transistor and output a current sense signal to an input of said PWM control circuit.

11. The circuit of claim 8, further comprising a discontinuous mode detection circuit coupled to said low-side power transistor and configured to generate a discontinuous mode detection signal for application to an input of said PWM control circuit.

12. The circuit of claim 1, wherein the circuit is implemented as an integrated circuit.

13. A circuit, comprising:
a high-side power transistor having a source-drain path coupled between a first node and a second node;
a low-side power transistor having a source-drain path coupled between the second node and a third node;
a high-side drive circuit having an input configured to receive a drive signal and an output configured to drive a control terminal of said high-side power transistor, said high-side drive circuit including a capacitive driver; and
a low-side drive circuit having an input configured to receive a complement drive signal and an output configured to drive a control terminal of said low-side power transistor, said low-side drive circuit including a level-shifting driver;
wherein said capacitive driver comprises:
    a first half-bridge driver having an input responsive to said drive signal;
    a first bootstrap capacitor coupled between an output of the first half-bridge driver and the control terminal of the high-side power transistor;
    an inverting circuit configured to invert the output of the first half-bridge driver;
    a second bootstrap capacitor coupled between an output of the inverting circuit and a fourth node; and
    a transistor having a source-drain path coupled between the control terminal of the high-side power transistor and the second node, said transistor having a control terminal coupled to said fourth node.

14. The circuit of claim 13, wherein the first node is coupled to receive a positive supply voltage and the third node is configured to output a negative supply voltage, further including a load circuit coupled between the third node and the second node.

15. The circuit of claim 13, wherein said level-shifting driver comprises:
    a level shifting circuit having an input responsive to said complement drive signal; and
    a second half-bridge driver having an input responsive an output of the level shifting circuit and an output coupled to the control terminal of said low-side power transistor.

16. The circuit of claim 15, wherein said level-shifting driver further comprises a regulator circuit configured to generate a clamp voltage supplying power to said level shifting circuit and said second half-bridge driver.

17. The circuit of claim 13, wherein said capacitive driver further comprises:
a switching transistor having a source drain path coupled between the first bootstrap capacitor and the control terminal of the high-side power transistor, wherein a control terminal of the switching transistor is coupled to said first node.

18. The circuit of claim 17, wherein said capacitive driver further comprises a diode coupled between said first node and a fifth node positioned between the first bootstrap capacitor and the switching transistor.

19. The circuit of claim 13, wherein the capacitive driver further comprises a clamping circuit coupled between the control terminal of said transistor and the second node.

20. The circuit of claim 13, further comprising a pulse width modulated (PWM) control circuit configured to generate said drive signal and said complement drive signal as PWM signals.

21. The circuit of claim 20, further comprising a feedback circuit coupled between said third node and an input of said PWM control circuit.

22. The circuit of claim 20, further comprising a current sensing circuit configured to sense current flow through said high-side power transistor and output a current sense signal to an input of said PWM control circuit.

23. The circuit of claim 20, further comprising a discontinuous mode detection circuit coupled to said low-side power transistor and configured to generate a discontinuous mode detection signal for application to an input of said PWM control circuit.

24. The circuit of claim 13, wherein the circuit is implemented as an integrated circuit.

* * * * *